US008685855B2

(12) United States Patent  
Nakayama et al.

(10) Patent No.: US 8,685,855 B2  
(45) Date of Patent: Apr. 1, 2014

(54) TRAY FOR CVD AND METHOD FOR FORMING FILM USING SAME

(75) Inventors: Takashi Nakayama, Tokyo (JP); Tomoyuki Kabasawa, Tokyo (JP); Takayuki Kihara, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 13/513,610

(22) PCT Filed: Nov. 29, 2010

(86) PCT No.: PCT/JP2010/006943  
§ 371 (c)(1),  
(2), (4) Date: Jun. 4, 2012

(87) PCT Pub. No.: WO2011/070741  
PCT Pub. Date: Jun. 16, 2011

(65) Prior Publication Data  
US 2012/0244703 A1    Sep. 27, 2012

(30) Foreign Application Priority Data

Dec. 11, 2009  (JP) ................................. 2009-282053  
Sep. 30, 2010  (JP) ................................. 2010-220977

(51) Int. Cl.  
*H01L 21/44*    (2006.01)  
*B31D 3/00*    (2006.01)  
*C23C 16/00*    (2006.01)

(52) U.S. Cl.  
USPC ................ 438/680; 216/55; 216/57; 216/58; 216/67; 118/715; 118/724

(58) Field of Classification Search  
USPC ................ 216/56, 57, 58, 67; 118/715, 724; 438/680  
See application file for complete search history.

(56) References Cited

U.S. PATENT DOCUMENTS

| | | | |
|---|---|---|---|
| 5,904,769 A * | 5/1999 | Ohashi et al. | 117/89 |
| 6,344,631 B1 * | 2/2002 | Chacin | 219/390 |
| 2007/0204796 A1 * | 9/2007 | Hirata et al. | 118/715 |
| 2008/0110401 A1 * | 5/2008 | Fujikawa et al. | 118/724 |
| 2012/0256363 A1 * | 10/2012 | Okita et al. | 269/289 R |

FOREIGN PATENT DOCUMENTS

| | | |
|---|---|---|
| JP | 04-211117 | 8/1992 |
| JP | 09-194926 | 7/1997 |
| JP | 11-329983 | 11/1999 |
| JP | 2004-533117 | 10/2004 |
| JP | 2007-258694 | 10/2007 |
| WO | 2005/111266 | 11/2005 |

* cited by examiner

Primary Examiner — Long K Tran  
(74) Attorney, Agent, or Firm — Clark & Brody

(57) ABSTRACT

A tray for film formation by a CVD method includes a tray main body (2) and a supporting member (3) mounted on the tray main body (2) for supporting a silicon wafer (5). The supporting member (3) has a holding portion (3c), on which the silicon wafer (5) is directly placed. The holding portion (3c) has its lower surface (3d) apart from a surface (2a) of the tray main body that is opposed to and apart from the supported silicon wafer (5), whereby the thickness distribution of an oxide film formed on the silicon wafer can be made uniform. The tray has a structure for reducing a contact area between the supporting member (3) and the tray main body (2), with the holding portion (3c) having a tilted surface with its inner circumferential side closer to the tray main body surface (2a) that is opposed to the silicon wafer.

17 Claims, 7 Drawing Sheets (a)

(b)

(c)

(d)

(a)

(b)

(c)

(a)

(b)

(c)

(a)

(b)

(a)

(b)

(a)

(b)

TRAY FOR CVD AND METHOD FOR FORMING FILM USING SAME

TECHNICAL FIELD

The present invention relates to a tray for CVD on which a silicon wafer is placed, which is used in film forming by a CVD method, and a film forming method using the same, and more specifically, a tray for CVD that permits the thickness distribution of an oxide film formed on a surface of the silicon wafer to be uniform, and a film forming method using the same.

BACKGROUND ART

In a device process and an epitaxial silicon wafer production process, a protective film and an insulating film are formed on a silicon wafer. For example, in the device process, an oxide film and the like are formed as an interlayer insulating film on the surface side of the silicon wafer to be used as a device fabrication region, then wiring formation and the like are performed.

In addition, in the production process of an epitaxial wafer, when a silicon epitaxial layer with high resistivity is vapor-deposited on a main surface of a silicon single-crystal substrate with low resistivity, a phenomenon that dopant in the silicon single-crystal substrate is once released to the vapor phase from the back surface etc. of the silicon single-crystal substrate and then doped in the silicon epitaxial layer, so-called, auto-doping, is liable to occur. Therefore, before performing vapor deposition, a silicon oxide film as a protective film for preventing auto-doping is formed on the back side of the silicon single-crystal substrate, the back side being free of epitaxial layer formation.

In general, when an oxide film is formed as an insulating film or protective film on a silicon wafer, an atmospheric CVD method is used. In the atmospheric CVD method, a silicon wafer is placed face up on a tray, with the film formation face being up, thereafter the tray and the silicon wafer are heated while supplying a source gas on the silicon wafer, whereby specific elements according as the source gas are deposited on the silicon wafer to allow film formation. The reason why the atmospheric CVD method is widely used when forming an oxide film is that due time for the formation of an oxide film can be shortened since the film-forming rate is high, and also that an oxide film can be continuously formed on the silicon wafer by incorporating a conveyance device.

In the atmospheric CVD method described above, a mixed gas of monosilane ($SiH_4$) and oxygen ($O_2$) or a mixed gas of tetraethoxysilane (TEOS, chemical formula: $Si(OC_2H_5)_4$) and ozone ($O_3$) is used as the source gas.

When an oxide film is formed by the atmospheric CVD method, a tray on which a silicon wafer is placed is required not to deform due to heating when forming a film, and not to be a cause for generation of contamination on the silicon wafer. Therefore, one obtained by sintering SiC or another obtained by further coating its surface with SiC film are used as the tray. As a general tray shape, a tray in which a holding portion for the silicon wafer is flat is used.

FIG. 10 is a cross section showing the state where a silicon wafer is placed on a conventional tray in which a holding portion is flat. A tray 1 shown in FIG. 10 has a flat holding portion 1a on which a silicon wafer 5 is placed. When film formation is performed on a film formation surface 5a of the silicon wafer by an atmospheric CVD method using the tray shown in FIG. 10, the opposite surface 5c of the silicon wafer, free of film formation, that does not allow film forming is in contact with the holding portion 1a of the tray when placing the silicon wafer 5 on the tray 1, and thus flaws occur over the whole opposite surface 5c, free of film formation, of the silicon wafer. Such contact-incurred flaws with a depth of about 3 to 10 μm occur while the depth of flaw varies slightly depending on film forming conditions.

When the formed oxide film is used as an interlayer insulating film, if rapid thermal history is provided to the silicon wafer by thermal treatment such as Flash Lamp Anneal in the device process and the like, there is a risk that the contact-incurred flaws induce cracking of the silicon wafer initiated from such flaws, and the product yield may be deteriorated. In addition, when the oxide film is used as a protective film, if an epitaxial layer is formed on the surface of the silicon wafer where contact-incurred flaws occur, there is a problem to generate stacking faults and the like in the epitaxial layer, initiating from such flaws. To deal with such a problem of generating contact-incurred flaws on the silicon wafer during film formation by an atmospheric CVD method, Patent Literature 1 uses a tray that supports the silicon wafer in its periphery region.

FIG. 11 is a cross section showing the state where a silicon wafer is placed on a conventional tray that supports the silicon wafer in its periphery region. A tray 1 shown in FIG. 11 has a tapered holding portion 1a, wherein the holding portion 1a supports the silicon wafer in its periphery region 5b, and a silicon wafer 5 is placed on the tray 1.

When the tray that supports the silicon wafer in its periphery region is used, the silicon wafer is supported so as not to allow a film-formation-free surface 5c of the silicon wafer to come in contact with the tray 1, and thus occurrence of contact-incurred flaws can be substantially reduced.

However, according to the experiment of the present inventors, it has been found that, when the tray that supports the silicon wafer in its periphery region is used, in a case of heating during film formation by an atmospheric CVD method, the surface temperature near the periphery of the silicon wafer is raised by heat conduction from the tray 1 to the periphery 5b of the silicon wafer to thereby vary the temperature distribution in the film formation surface 5a of the silicon wafer, and thus there is a problem that the thickness of the formed oxide film is made non-uniformly. Specifically, since the increase in the surface temperature accelerates the growth rate of the oxide film, an oxide film formed on the film formation surface 5a of the silicon wafer is thin in the central part and thick near the periphery.

Therefore, in the device process using the formed oxide film as an interlayer insulating film, when a silicon wafer with non-uniform thickness of the oxide film is used, there is a problem that device characteristics formed on the oxide film are notably deteriorated.

In addition, in recent years, it is desired to provide an epitaxial silicon wafer having high flatness, and when the thickness of oxide film in a silicon wafer for use is non-uniform, there is a problem that flatness of the epitaxial wafer to be formed thereafter is deteriorated.

Furthermore, when there is a flaw on the surface of the silicon wafer where an epitaxial layer is formed as described above, imperfections may be generated in the formed epitaxial layer. Therefore, after forming an oxide film, the film-formation-free surface is polished, as being one-side polishing, before carrying out epitaxial growth treatment, to carry out an operation to remove the oxide film, flaws, and the like.

However, during the treatment of one-side polishing, since the film formation surface is supported and the film-formation-free surface is to be polished, if the thickness distribution of an oxide film is non-uniform, the wafer is supported while elastically deformed, and non-uniform thickness distribution of an oxide film is transferred to the film-formation-free surface after polishing, and thus flatness of the silicon wafer is deteriorated. The more the polishing amount, the larger the deterioration of flatness, and it also affects to flatness of the epitaxial wafer to be formed thereafter.

CITATION LIST

Patent Literature

PATENT LITERATURE 1: Japanese Patent Application Publication No. 11-329983

SUMMARY OF INVENTION

Technical Problem

As described above, in the conventional tray used in the formation of an oxide film by an atmospheric CVD method, there have been a problem that contact-incurred flaws occur on a film-formation-free surface of a silicon wafer and a problem that the thickness distribution of an oxide film formed on a silicon wafer is non-uniform.

The present invention has been made in consideration of such situation, and it is an object of the present invention to provide a tray for CVD that permits the thickness distribution of an oxide film formed on a silicon wafer to be uniform without generating a contact-incurred flaw on a film-formation-free surface of the silicon wafer when handled in film forming by an atmospheric CVD method, and a film forming method using the same.

Solution to Problem

As a result of conducting various tests and intensive studies by the present inventors for solving the above-described problems, it has been found that uniform thickness distribution of an oxide film formed on the silicon wafer can be achieved by making a tray comprising a tray main body and a supporting member mounted on the tray main body and by supporting a silicon wafer, the supporting member having a holding portion on which the silicon wafer is directly placed, while the holding portion having its lower surface which is apart from the tray main body.

In addition, it has been revealed that uniform thickness distribution of an oxide film formed on the silicon wafer can be achieved without generating a contact-incurred flaw on the silicon wafer by constructing the holding portion with a tilted surface, configuring it such that the inner circumferential side thereof is closer to the tray main body surface that is apart from and opposed to the held silicon wafer, and using this holding portion to support the silicon wafer in its periphery.

Furthermore, it has been found that more uniform thickness distribution of an oxide film formed on the silicon wafer can be achieved by providing the tray with a structure for reducing the contact area between the supporting member and the tray main body.

The present invention was completed based on the above-mentioned knowledge, and summaries of the present invention are trays for CVD of the following (1) to (9) and the film forming method of the following (10).

(1) A tray for CVD, which is used in film forming by a CVD method, comprises: a tray main body; and a supporting member mounted on the tray main body and supporting a silicon wafer, wherein the supporting member is provided with a holding portion on which the silicon wafer is directly placed, and the holding portion has its lower surface which is apart from a tray main body surface, the tray main body surface being apart from and opposed to the supported silicon wafer.

(2) The tray for CVD, wherein the tray as defined in the above (1) has a structure for reducing a contact area between the supporting member and the tray main body.

(3) The tray for CVD according to the above (2), wherein, as the structure for reducing the contact area, the tray has a structure in which the tray main body is provided with land portions, and the supporting member is mounted on the land portions.

(4) The tray for CVD according to the above (2), wherein, as the structure for reducing the contact area, the tray has a structure in which the supporting member is mounted on the tray main body maintaining point contact or line contact.

(5) The tray for CVD, wherein the tray as defined in the above (2) is further equipped with a jig supporting the supporting member, and, as the structure for reducing the contact area, the tray has a structure in which the supporting member is mounted on the tray main body maintaining point contact or line contact by the jigs.

(6) The tray for CVD according to the above (3), wherein the tray main body has a concave receiving part that houses the supporting member, and the inner periphery of the receiving part is configured to have a tilted surface and such that the upper end thereof is back away from the center of the receiving part.

(7) The tray for CVD according to any of the above (1) to (6), wherein the holding portion is configured to have a tilted surface and such that the inner circumferential side thereof is closer to the tray main body surface, the tray main body surface being opposed to and apart from the supported silicon wafer, and supports the silicon wafer in its periphery.

(8) The tray for CVD according to any of the above (1) to (7), wherein the holding portion is in a ring shape.

(9) The tray for CVD according to any of the above (1) to (8), wherein the holding portion is made of SiC.

(10) A film forming method, comprising the steps of: placing a silicon wafer on a tray, and then heating the silicon wafer while supplying a source gas on the silicon wafer, to form a film on the silicon wafer by a CVD method, wherein the tray for CVD as defined in any of the above (1) to (9) is used.

Advantageous Effects of Invention

Since a tray main body and a holding portion of a supporting member that supports a silicon wafer are apart from each other, the tray for CVD of the present invention can reduce heat conduction from the holding portion to the periphery of the silicon wafer and permit the thickness distribution of the formed oxide film to be uniform when it is used in film forming on the silicon wafer by an atmospheric CVD method.

In addition, since the holding portion is configured to have a tilted surface and such that the inner circumferential side thereof is closer to the tray main body surface, the tray main body surface being opposed to the supported silicon wafer, and supports the silicon wafer in its periphery, uniform thickness distribution of the formed oxide film can be achieved without generating a contact-incurred flaw on a film-formation-free surface of the silicon wafer when the tray is used in film forming on the silicon wafer by an atmospheric CVD method.

Furthermore, by providing the tray with a structure for reducing the contact area between the supporting member and the tray main body, heat conduction from the tray main body to the supporting member is reduced, and thus heat conduction from the holding portion to the periphery of the silicon wafer is further reduced, and more uniform thickness distribution of the formed oxide film can be achieved.

BRIEF DESCRIPTION OF DRAWINGS

FIG. 2 are views showing an embodiment of the present invention in which a tray main body is provided with land portions, wherein FIG. 2(a) is a top view, FIG. 2(b) is an A-A cross section in the FIG. 2(a), and FIG. 2(c) is a B-B cross section in the FIG. 2(a).

FIG. 4 are views showing an embodiment of the present invention in which a supporting member is mounted maintaining point contact and line contact, wherein FIG. 4(a) is a top view and FIG. 4(b) is an A-A cross section in the FIG. 4(a).

DESCRIPTION OF EMBODIMENTS

Hereinafter, configuration examples of the tray for CVD of the present invention will be shown, and also the film forming method using the same will be described in detail.

[Tray for CVD as of First Embodiment]

Figure 1:
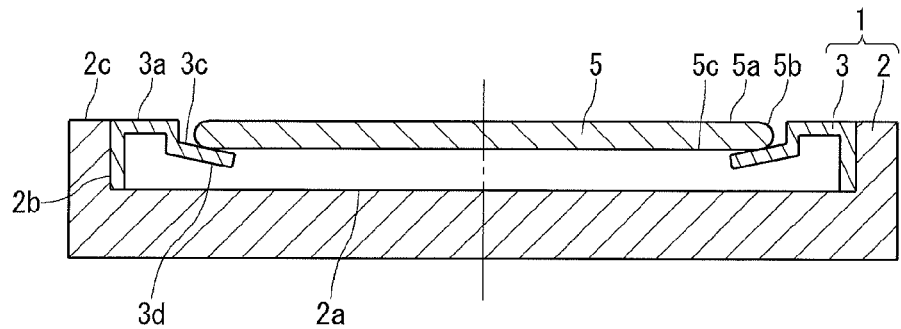
FIG. 1 are views showing embodiments of the present invention comprising a tray main body and a supporting member, wherein FIG. 1(a), FIG. 1(b), FIG. 1(c) and FIG. 1(d) respectively show one case that a tray main body has a receiving part, another case where a planar tray main body is used and a supporting member is proped in its periphery region, yet another case that a planar tray main body is used and a supporting member is proped around its middle position, and the other case that a concave portion is provided in a tray main body surface that is opposed to a silicon wafer.
Figure 1:
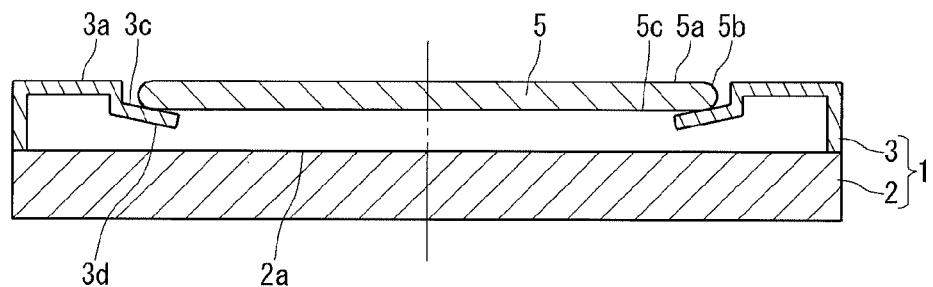
Figure 1:
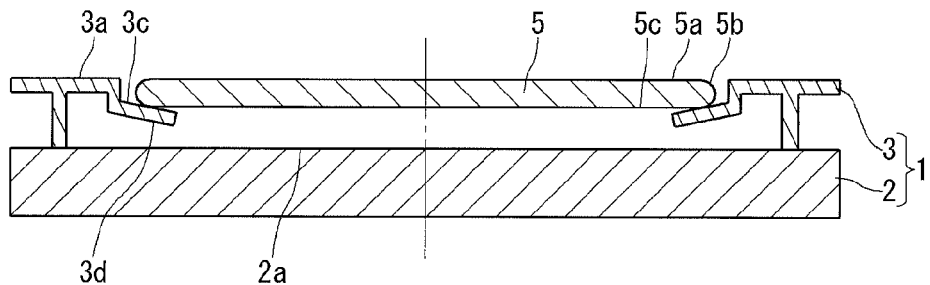
Figure 1:
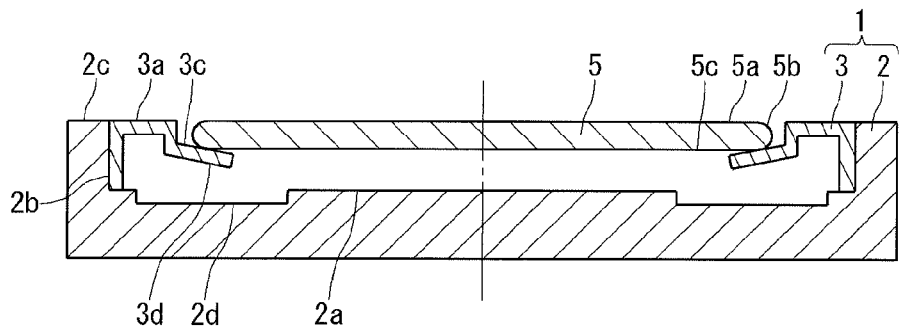

FIG. 1 are views showing embodiments of the present invention comprising a tray main body and a supporting member, wherein FIG. 1(a), FIG. 1(b), FIG. 1(c) and FIG. 1(d) respectively show one case that a tray main body has a receiving part, another case that a planar tray main body is used and a supporting member is proped in its periphery region, yet another case that a planar tray main body is used and a supporting member is proped around its middle part, and the other case that a concave portion is provided in the tray main body surface that is opposed to a silicon wafer. Tray 1 each shown in FIGS. 1 (a) to (d) comprise a tray main body 2 and a supporting member 3, wherein a silicon wafer 5 is supported and placed on a holding portion 3c disposed in the supporting member 3.

The tray for CVD of the first embodiment of the present invention is a tray 1, which is used in film forming by a CVD method, comprises a tray main body 2, and a supporting member 3 mounted on the tray main body 2 and supporting a silicon wafer 5, wherein the supporting member 3 is provided with a holding portion 3c on which the silicon wafer 5 is directly placed, and furthermore, the holding portion 3c has its lower surface 3d as being apart from a tray main body surface 2a that is apart from and opposed to the supported silicon wafer.

The holding portion 3c on which the silicon wafer 5 is directly placed is provided with its lower surface 3d, and the holding portion 3c is apart from the tray main body surface 2a that is opposed to the silicon wafer, whereby the amount of the heat retained in the tray main body 2 and then conducted to the holding portion 3c can be reduced, and thus heat conduction from the tray 1 to the periphery 5b of the silicon wafer can be reduced. Herewith, an increase in the temperature near the periphery of the silicon wafer when used in film forming by an atmospheric CVD method is reduced, and the thickness of an oxide film formed on the silicon wafer can be made uniform.

In order to configure the lower surface 3d in the holding portion 3c of the supporting member 3 to allow the holding portion 3c to be way apart from the tray main body surface 2a that is opposed to the silicon wafer, the embodiments shown in FIGS. 1(a) to (c) can be adopted. FIG. 1(a) shows an embodiment of one case that a tray main body having a concave receiving part is used where a supporting member is housed, and FIGS. 1(b) and (c) show embodiments of using a planar tray main body. The tray for CVD of the present invention is not limited to the embodiments shown in FIGS. 1(a) to (c), but various structures can be adopted in order to allow the holding portion 3c to be apart from the tray main body.

The tray for CVD of the first embodiment of the present invention preferably has a structure for reducing the contact area between the supporting member and the tray main body.

In the trays shown in FIGS. 1(a) to (d) described above, the heat conducts from the tray main body to the supporting member when the trays are used in film forming by an atmospheric CVD method, then the heat may conduct to the silicon wafer supported on the supporting member. In this case, part of the silicon wafer in contact with the holding portion of the supporting member and the area near the contact part become high in temperature, and eventually the thickness distribution of an oxide film formed on the silicon wafer becomes non-uniform.

Herein, in the heat conducted from the tray main body to the supporting member, the proportion of the heat conducted through the contact part between the tray main body and the supporting member is large. Therefore, the amount of the heat retained in the tray main body and then conducted to the supporting member can be reduced by providing the tray with a structure for reducing the contact area between the supporting member and the tray main body. Herewith, the heat of the tray main body is prevented from conducting to the supporting member, and thus the increase in the temperature of the contact part and the vicinity thereof between the silicon wafer and the supporting member can be suppressed. As a result, the thickness of an oxide film formed on the silicon wafer can be made more uniform.

As a method of suppressing the increase in the temperature of the part of contact and its vicinity between the silicon wafer and the supporting member by the heat conducted from the part where the tray main body and the supporting member are in contact, a method of extending a distance from the part of the supporting member in contact with the tray main body to the holding portion is considered. However, in order to extend the distance from the part of the supporting member in contact with the tray main body to the holding portion, it is necessary to use a tray main body and supporting member with the size far exceeding the diameter of the held silicon wafer.

In this case, in an atmospheric CVD method that generally continuously forms films using a specific conveyance device, it becomes a problem since the productivity gets worse when the tray becomes large in size, and it also becomes a problem since substantial modification of the CVD system used in film forming is required, and the equipment cost increases. If the above method that provides the tray with a structure for reducing the contact area between the supporting member and the tray main body is used, uniform thickness distribution of an oxide film formed on the silicon wafer can be achieved without generating the problems of productivity deterioration and increase in the equipment cost.

The embodiments of the tray for CVD of the present invention that can be adopted as the structure for reducing the contact area between the supporting member and the tray main body are shown in the following second embodiment to fourth embodiment.

[Tray for CVD as of Second Embodiment]

Figure 2:
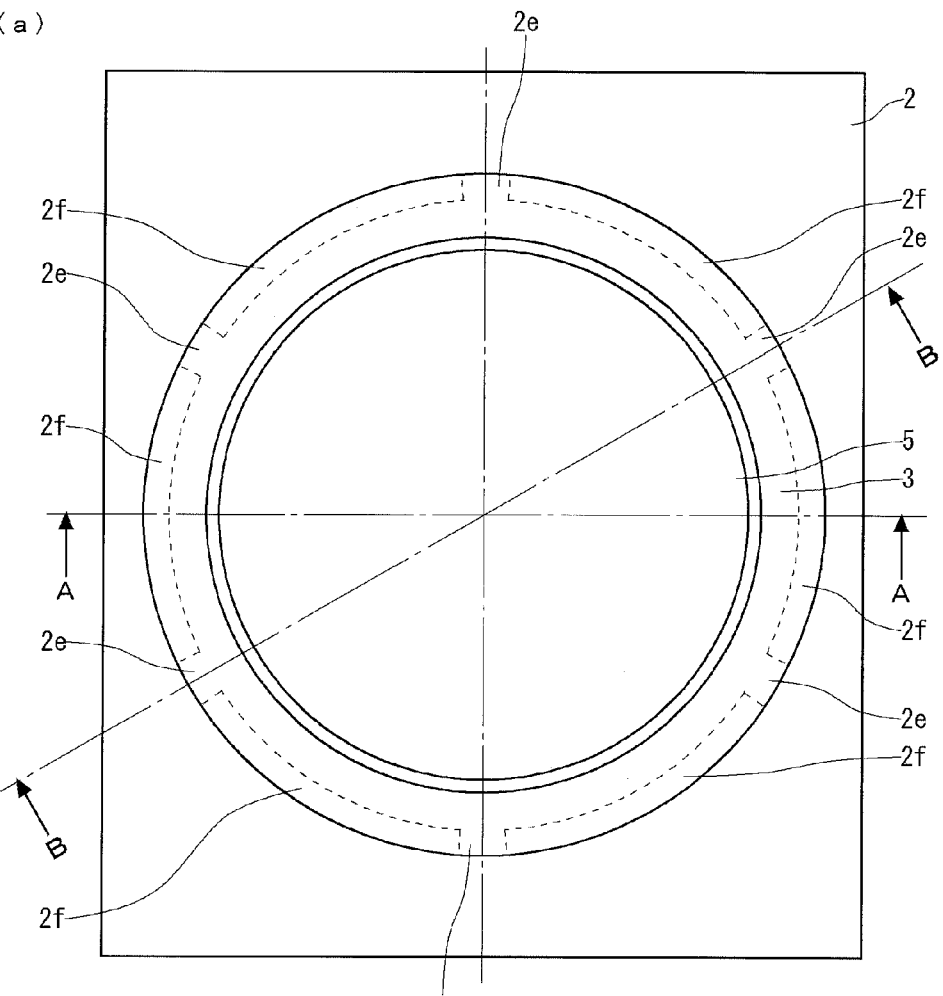
Figure 2:
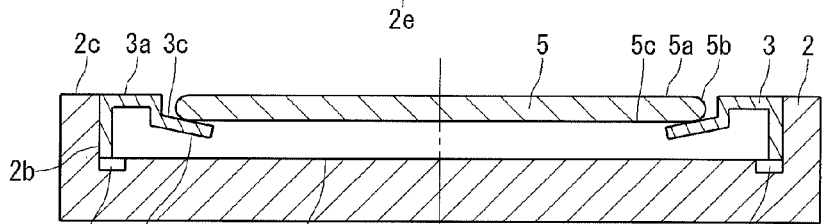
Figure 2:
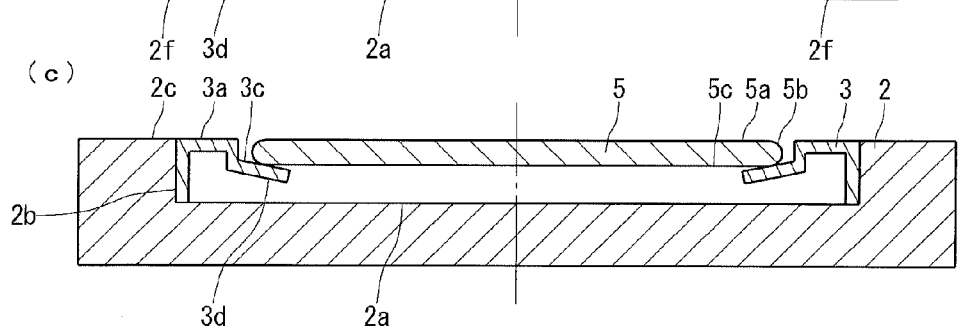

FIG. 2 are views showing an embodiment of the present invention in which a tray main body is provided with land portions, wherein FIG. 2(a) is a top view, FIG. 2(b) is an A-A cross section in the FIG. 2(a), and FIG. 2(c) is a B-B cross section in the FIG. 2(a). The tray each shown in FIG. 2 comprises a tray main body 2, and a supporting member 3 mounted on the tray main body 2 and supporting a silicon wafer 5. In addition, the supporting member 3 is provided with a holding portion 3c on which the silicon wafer 5 is directly placed, having its lower surface 3d which is apart from the tray main body 2.

The tray for CVD of the second embodiment of the present invention is characterized in that the tray main body 2 is provided with land portions 2e, and the tray has a structure in which the supporting member 3 is mounted on the land portions 2e, as the structure for reducing the contact area between the supporting member 3 and the tray main body 2. In the tray shown in FIG. 2, six grooves 2f are provided where the supporting member 3 is at rest on the tray main body 2 as shown in a top view of FIG. 2(a) by dashed lines, whereby six land portions 2e are formed. Therefore, the set supporting member 3 is in contact with the tray main body at the land portions 2e without allowing grooves 2f to come in contact with the tray main body 2, and thus the contact area between the supporting member 3 and the tray main body 2 can be reduced.

The tray for CVD of the second embodiment of the present invention is not limited to the embodiment shown in FIG. 2, but an embodiment wherein the inner periphery of a receiving part of the tray main body where the supporting member is housed and disposed is configured to have a tilted surface and an embodiment using a planar tray main body can be also adopted.

Figure 3:
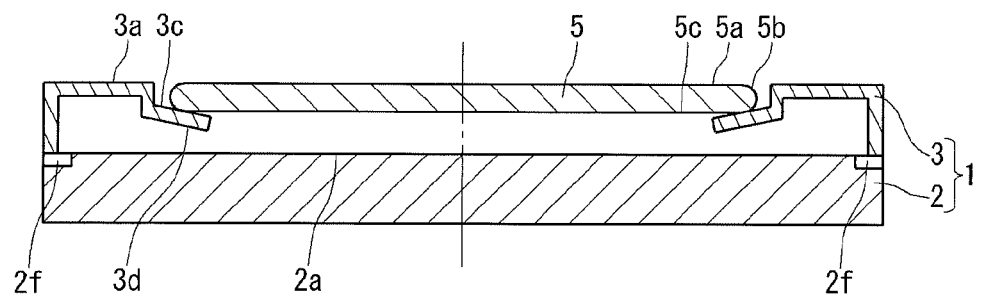
FIG. 3 are cross sections showing embodiments of the present invention in which a tray main body is provided with land portions, wherein FIG. 3(a), FIG. 3(b) and FIG. 3(c) respectively show one case that a planar tray main body is used, another case where a tray main body has a receiving section, and the other case that a concave section is provided on the tray main body in the area below a holding portion.
Figure 3:
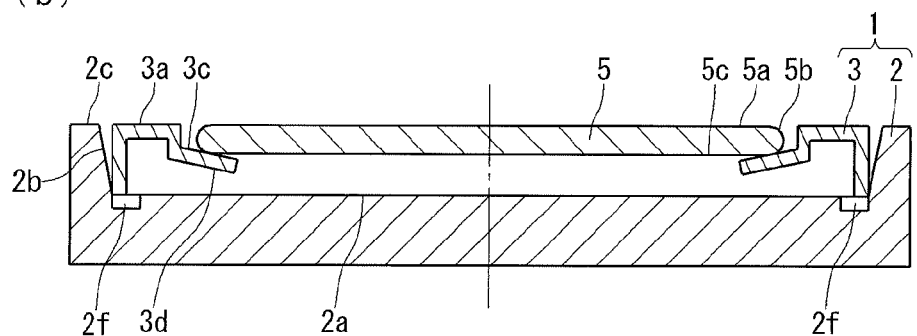
Figure 3:
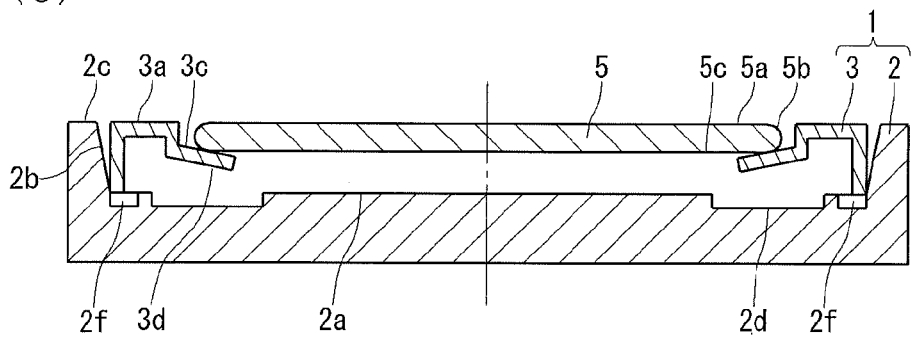

FIG. 3 are cross sections showing embodiments of the present invention in which a tray main body is provided with land portions, wherein FIG. 3(a), FIG. 3(b) and FIG. 3(c) respectively show one case that a planar tray main body is used, another case that a tray main body has a receiving part, and the other case that a concave portion is provided in the area below a holding portion. In the trays shown in FIGS. 3(a) to (c), while not illustrated, six grooves are provided where the supporting member of the tray main body is at rest in the same manner as in the tray shown in FIG. 2, while six land portions are formed. Therefore, the set supporting member 3 is in contact with the tray main body at the land portions without allowing the grooves 2f to come in contact with the tray main body 2, and thus the contact area between the supporting member and the tray main body can be reduced.

As described above, the contact area between the supporting member and the tray main body can be reduced by providing the tray with a structure where the tray main body is provided with land portions where the supporting member is mounted on the land portions. Therefore, when the tray for CVD of the second embodiment of the present invention is used in film forming of a silicon wafer by an atmospheric CVD method, more uniform thickness distribution of the formed oxide film can be achieved.

In the tray for CVD of the second embodiment of the present invention, at least three land portions should be provided. In addition, the land portions can be formed into various shapes so long as the supporting member can be stably mounted.

In the tray for CVD of the second embodiment of the present invention, as shown in FIG. 3(b), when the tray main body 2 has a concave receiving part that houses the supporting member 3, it is preferable that the inner periphery 2b of the receiving part of the tray main body is configured to have a tilted surface and also such that the upper end thereof is back away from the center of the receiving part. Herewith, the supporting member 3 maintains line contact with the inner periphery without allowing the supporting member 3 to come in contact with the major part of the inner periphery 2b of the concave receiving part, and thus the contact area between the supporting member 3 and the tray main body 2 can be further reduced.

As the structure for reducing the contact area between the inner periphery of the receiving part of the tray main body and the supporting member, besides the above structure, an alternative structure in which the inner periphery of the receiving part of the tray main body is configured to have a tilted surface and such that the bottom end thereof is back away from the center of the receiving part can be adopted. In addition, another alternative structure in which the surface of the supporting member in contact with the inner periphery of the receiving part is tilted and a structure in which a plurality of grooves are provided on the inner periphery of the receiving part or the surface of the supporting member in contact with the inner periphery can be also adopted. The tray for CVD of the present invention preferably adopts the structure in which the inner periphery of the receiving part of the tray main body is configured to have a tilted surface and such that the upper part thereof is back away from the center of the receiving part since it is the easiest to produce the tray, and the production cost can be reduced.

[Tray for CVD as of Third Embodiment]

Figure 4:
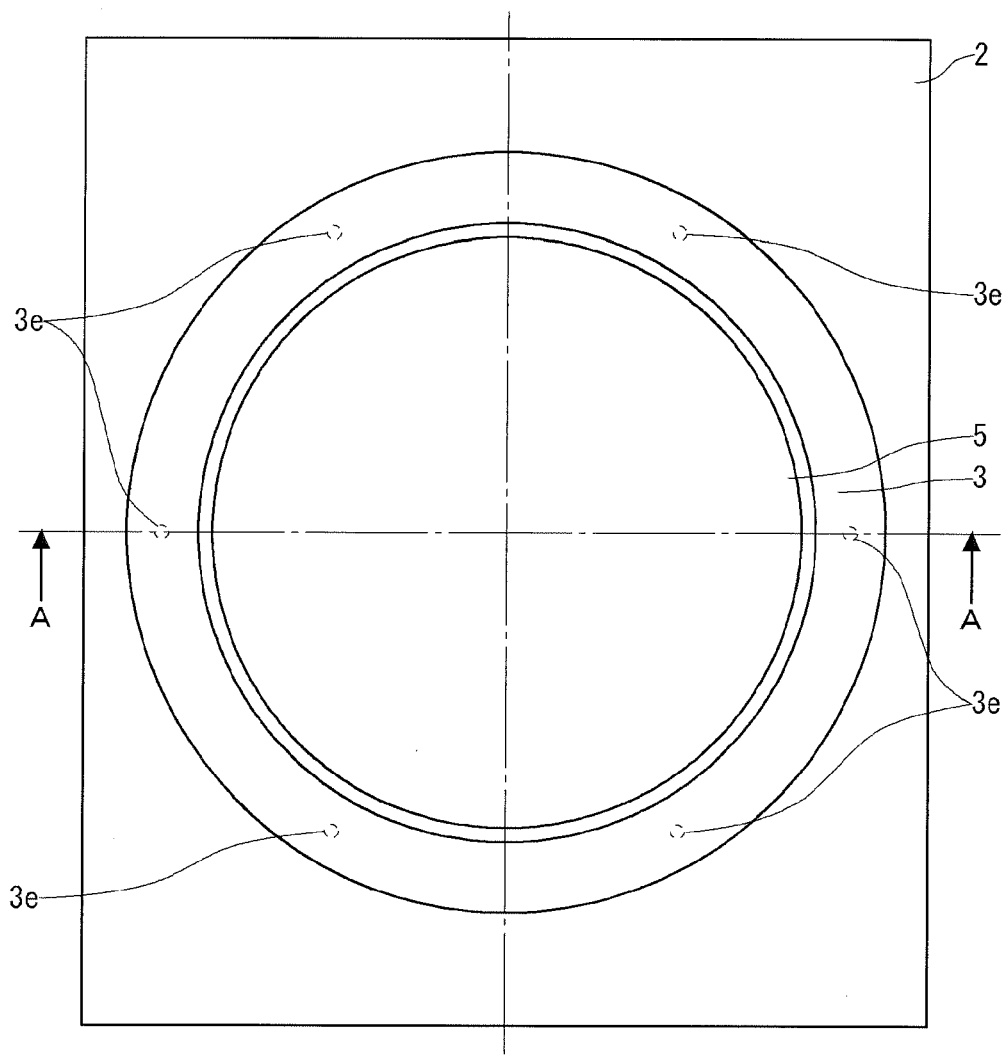
Figure 4:
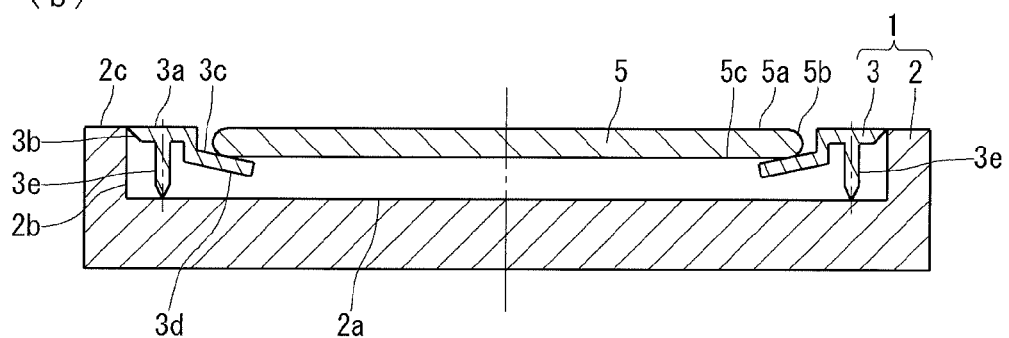

FIG. 4 are views showing an embodiment of the present invention in which a supporting member is mounted maintaining point contact and line contact, wherein FIG. 4(a) is a top view and FIG. 4(b) is an A-A cross section in the FIG. 4(a). The tray shown in FIG. 4 comprises a tray main body 2 having a concave receiving part for housing a supporting member 3, and the supporting member 3 mounted on the tray main body 2 and supporting a silicon wafer 5. In addition, the supporting member 3 is provided with a holding portion 3c, on which the silicon wafer 5 is directly placed, and also has its lower surface 3d, which is apart from the tray main body 2.

The tray for CVD of the third embodiment of the present invention is characterized in that the tray has a structure in which the supporting member 3 is mounted on the tray main body 2 maintaining point contact or line contact, as the structure for reducing the contact area between the supporting member 3 and the tray main body 2. In the tray shown in FIG. 4, the supporting member 3 is equipped with cylindrical supporting struts 3e, and the bottom part of struts 3e is in a conical shape, and thus the cross-sectional area thereof tapers off toward the bottom edge. As shown in FIG. 4(a), six struts 3e are provided concentrically with the held silicon wafer 5 at predetermined angular intervals. Also, an outer periphery 3b of the supporting member in contact with an inner periphery 2b of the receiving part of the tray main body has a tilted face such that the bottom part thereof is back away from the inner periphery of the receiving part of the tray main body.

When the above-described supporting member 3 is mounted on the tray main body 2, the supporting member 3 is mounted on the tray main body 2 maintaining point contact by means of bottom edges of a plurality of struts 3e provided in the supporting member 3 and line contact by means of the tilted outer periphery 3b of the supporting member 3. Therefore, the contact area between the supporting member 3 and the tray main body 2 can be reduced. While six struts 3e are provided in the tray shown in FIG. 4, at least three struts 3e should be provided when the supporting member 3 is mounted on the tray main body 2 maintaining point contact by the struts 3e of the supporting member 3. The tray for CVD of the third embodiment of the present invention is not limited to the embodiments shown in FIG. 4, but an embodiment using a planar tray main body and an embodiment of disposing the supporting member maintaining line contact can be adopted.

Figure 5:
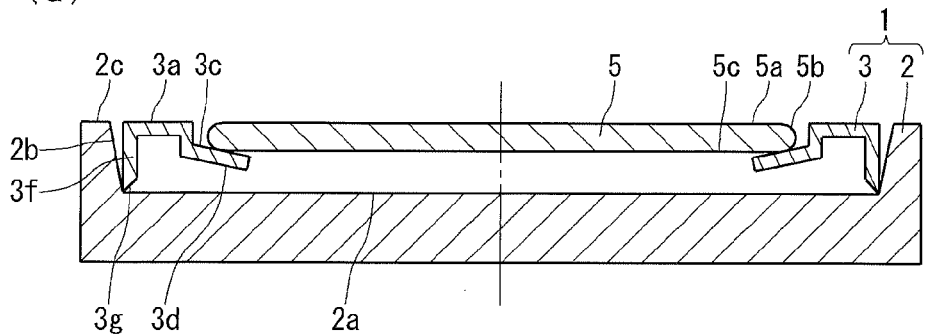
FIG. 5 are cross sections showing embodiments of the present invention in which a supporting member is mounted maintaining line contact, wherein FIG. 5(a) and FIG. 5(b) respectively show one case that the line contact is maintained in mounting the supporting member on a tray main body having a concave receiving part and the other case that the line contact is maintained in mounting the supporting member on a planar tray main body.
Figure 5:
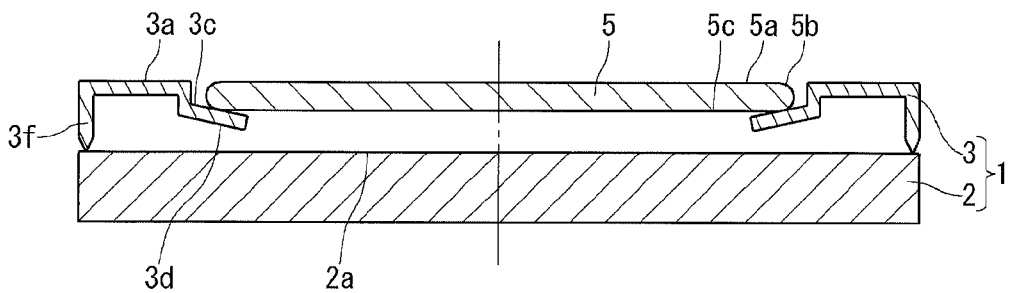

FIG. 5 are cross sections showing embodiments of the present invention in which a supporting member is mounted maintaining line contact, wherein FIG. 5(a) and FIG. 5(b) respectively show one case of that of being mounted on a tray main body having a concave receiving part while maintaining line contact and the other case of being mounted on a planar tray main body while maintaining line contact.

The tray shown in FIG. 5(a) comprises a tray main body 2 having a concave receiving part for housing a supporting member 3, and the supporting member 3. A holding portion 3c and a silicon wafer 5 are supported by a peripheral cylindrical supporting part 3f of the supporting member 3. In the tray shown in FIG. 5(a), an inner periphery 2b of the concave receiving part of the tray main body is configured to have a tilted surface and such that the upper end thereof is back away from the central portion of the receiving part, and a lower end 3g of the cylindrical supporting part provided in the supporting member 3 is tilted such that the inner peripheral edge is back away from a tray main body surface 2a that is opposed to the silicon wafer 5.

Herewith, in the tray shown in FIG. 5(a), the supporting member 3 is mounted on the tray main body 2 maintaining line contact by means of the bottom edge of the cylindrical supporting part 3f of the supporting member 3 without allowing the major part of the outer periphery and lower end surface of the supporting part 3f of the supporting member 3 to come in contact with the tray main body 2. Therefore, the contact area between the supporting member 3 and the tray main body 2 can be reduced.

The tray shown in FIG. 5(b) comprises a planar tray main body 2 and a supporting member 3 provided with a cylindrical supporting part 3f. In the tray shown in FIG. 5(b), the cylindrical supporting part 3f of the supporting member 3 has tilted inner and outer peripheries at its bottom part, and thus the cross-sectional area thereof tapers off toward the bottom edge. Herewith, in the tray shown in FIG. 5(b), the supporting member 3 is mounted on the planar tray main body 2 maintaining line contact between the bottom edge of the cylindrical supporting part 3f of the supporting member 3 and the planar tray main body 2. Therefore, the tray shown in FIG. 5(b) can reduce the contact area between the supporting member 3 and the tray main body 2.

As described above, the contact area between the supporting member and the tray main body can be reduced by providing the tray with a structure in which the supporting member is mounted on the tray main body maintaining point contact or line contact. Therefore, when the tray for CVD of the third embodiment of the present invention is used in film forming of a silicon wafer by an atmospheric CVD method, more uniform thickness distribution of the formed oxide film can be achieved.

[Tray for CVD as of Fourth Embodiment]

Figure 6:
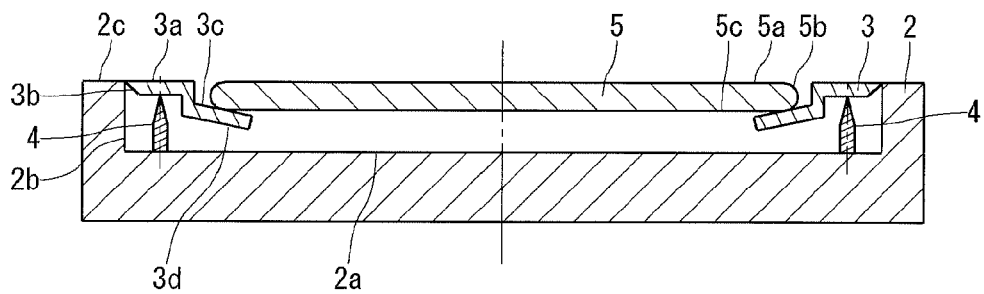
FIG. 6 are cross sections showing embodiments of the present invention in which a supporting member is mounted maintaining point contact or line contact by jigs, wherein FIG. 6(a) and FIG. 6(b) respectively show one case that a supporting member is mounted maintaining point contact, and the other case that a supporting member is mounted maintaining line contact.
Figure 6:
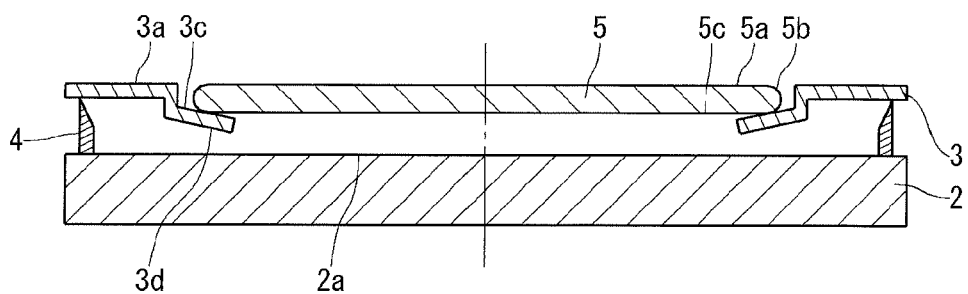

FIG. 6 are cross sections showing embodiments of the present invention in which a supporting member is mounted maintaining point contact or line contact by jigs, wherein FIG. 6(a) and FIG. 6(b) respectively show one case that a supporting member is mounted maintaining point contact and the other case that a supporting member is mounted maintaining line contact. The trays shown in FIGS. 6(a) and (b) comprise a tray main body 2, a supporting member 3 for supporting a silicon wafer, and jigs 4 holding the supporting member 3.

The tray for CVD of the fourth embodiment of the present invention is characterized in that the tray is equipped with jigs 4 for holding a supporting member 3, and has a structure in which the supporting member 3 is mounted on a tray main body 2 maintaining point contact or line contact by means of the jigs 4, as the structure for reducing the contact area between the supporting member 3 and the tray main body 2. In the tray shown in FIG. 6(a), the jigs 4 are in a cylindrical shape and the upper parts thereof each is formed into a conical shape with the cross-sectional area thereof tapering off toward the top edge. The cylindrical jigs 4 described above are arranged in a tray main body surface 2a that is opposed to the supported silicon wafer. In the tray shown in FIG. 6(a), besides the illustrated two cylindrical jigs 4, four cylindrical jigs 4 that are not illustrated are arranged concentrically with the supported silicon wafer 5 at predetermined angular intervals, and thus the supporting member 3 is mounted using the total of six jigs.

In the tray shown in FIG. 6(a), a plurality of the cylindrical jigs 4 are arranged in the tray main body 2, and the supporting member 3 is mounted on the conical top edge provided in the cylindrical jigs 4. Therefore, in the tray shown in FIG. 6(a), since the supporting member 3 is mounted on the tray main body 2 maintaining point contact by the jigs 4, the contact area between the supporting member 3 and the tray main body 2 can be reduced. While the six jigs 4 are arranged in the tray shown in FIG. 6(a), at least three jigs 4 should be arranged when the supporting member 3 is mounted on the tray main body 2 maintaining point contact by the jigs 4.

When the tray main body 2 has a concave receiving part that receives the supporting member 3 as shown in FIG. 6(a), in order to reduce the contact area between an outer periphery 3b of the supporting member and an inner periphery 2b of the concave receiving part of the tray main body, it is preferable that the outer periphery 3b of the supporting member is made into a tilted surface and is mounted such that the bottom part thereof is apart from the inner periphery 2b of the receiving part, as shown in FIG. 6(a).

Herein, when the outer periphery of the supporting member is made into a tilted surface, a method of disposing such that the upper part thereof is apart from the inner periphery of the receiving part can be also adopted. In the method of disposing such that the upper part thereof is apart from the inner periphery of the receiving part, when supplying a source gas on the silicon wafer, to form a film by a CVD method, flow of the source gas is disordered by a dent formed by the tilted surface, and there is a concern of causing adverse effects on the thickness distribution of an oxide film.

In addition, a method of making the inner periphery 2b of the receiving part of the tray main body into a tilted surface can be also adopted. In this method, when disposing such that the upper part of the inner periphery of the receiving part is apart from the center of the receiving part, flow of the source gas is disordered by the dent formed by the tilted surface described above, and there is a concern of causing adverse effects on the thickness distribution of an oxide film. On the other hand, it is also considered to dispose such that the bottom part of the inner periphery of the receiving part is apart from the center of the receiving part, but it makes the production of the tray main body difficult, and the product yield rate is deteriorated.

The outer periphery of the supporting member is made into a tilted surface and is mounted such that the bottom part thereof is apart from the inner periphery of the receiving part, then the concern about the thickness distribution of an oxide film due to disorder of the source gas flow can be resolved, and also the production of the tray becomes easier. Therefore, in order to reduce the contact area of the outer periphery of the supporting member with the inner periphery of the receiving part of the tray main body, it is preferable that the outer periphery of the supporting member is made into a tilted surface and is mounted such that the bottom part thereof is apart from the inner periphery of the receiving part.

The tray shown in FIG. 6(b) uses cylindrical jig 4. In this cylindrical jig 4, its top surface in contact with a supporting member 3 is made into a tilted surface and is mounted such that the inner circumferential side thereof is closer to a tray main body surface 2a that faces a silicon wafer 5. When the cylindrical jig 4 described above is arranged on a tray main body 2 and the supporting member 3 is mounted by the jig 4, the supporting member 3 is mounted in a state of being in line contact with the top edge of the top surface of the cylindrical jig 4. Therefore, the contact area between the supporting member 3 and the tray main body 2 can be reduced.

As described above, the area of the supporting member in contact with the tray main body through the jigs can be reduced by providing the tray with a structure in which the supporting member is mounted on the tray main body maintaining point contact or line contact by the jigs. Therefore, when the tray for CVD of the fourth embodiment of the present invention is used in film forming of a silicon wafer by an atmospheric CVD method, more uniform thickness distribution of the formed oxide film can be achieved.

[Preferred Embodiment to be Adopted for Holding Portion, Etc.]

The tray for CVD of the present invention described above preferably adopts the following embodiments.

In the tray for CVD of the present invention, in order to support the periphery 5b of a silicon wafer 5, it is preferable that a holding portion 3c comprises a tilted surface and is configured such that the inner circumferential side thereof is closer to the tray main body surface 2a that is apart from and opposed to the supported silicon wafer 5. Herewith, the silicon wafer can be supported without allowing a film-formation-free surface 5c of the silicon wafer to come in contact with the tray, and thus the thickness of an oxide film formed on a film formation surface 5a of the silicon wafer can be made uniform without generating a contact flaw on the film-formation-free surface 5c of the silicon wafer.

In the tray for CVD of the present invention, the holding portion 3c is preferably made in a ring shape. While, using a plurality of holding means, a silicon wafer can also be placed so as to be supported at plural locations at predetermined angular intervals in the periphery of the silicon wafer, in this case, openings are present between the holding means and the silicon wafer. When film forming is performed with a source gas going to the film-formation-free surface 5c of the silicon wafer from the openings upon film forming by a CVD method, the temperature distribution of a film formation surface 5a of the silicon wafer becomes non-uniform, and the thickness distribution of an oxide film may be deteriorated. In addition, the amount of film forming on the film-formation-free surface 5c of the silicon wafer is increased, and the amount of removal by polishing to be performed thereafter is increased.

Since the silicon wafer 5 is in contact with the holding portion 3c throughout the whole circumference by forming the holding portion 3c in a ring shape, the source gas can be prevented from getting around the film-formation-free surface of the silicon wafer, and the above-described concerns can be resolved.

As described above, a tray for CVD is required not to deform due to heating when forming a film, and not to be a cause for generation of contamination on the silicon wafer. Furthermore, in order to reduce the heat conduction from the holding portion 3c to the periphery 5b of the silicon wafer, the holding portion 3c preferably has a thin-wall structure with a thickness of 1 mm or less. In the tray for CVD of the present invention, in order to satisfy these requirements, the holding portion 3c is preferably made of SiC and preferably SiC alone, or the one obtained by forming an SiC film on the surface of a carbon substrate by a CVD method or an SiC film alone by a CVD method, and the holding portion 3c can be also made of an alternative material other than SiC so long as the material satisfies the above requirements.

In the tray for CVD of the present invention, height levels of the film formation surface 5a of the silicon wafer and the top surface 3a of the supporting member are preferably equalized when placing the silicon wafer, by adjusting the height of a top surface 3a of the supporting member or the depth of the holding portion 3c. In addition, when the tray main body has a concave receiving part for housing the supporting member, the height levels of the film formation surface 5a of the silicon wafer and the top surface 2c of the receiving part are preferably equalized when placing the silicon wafer. It is because the height level of the top surface 3a of the supporting member or the top surface 2c of the receiving part and the height level of the film formation surface 5a of the silicon wafer are different, then flow of the source gas supplied on the film forming surface of the silicon wafer is disordered, the thickness of an oxide film formed on the film formation surface 5a is locally thick or thin, and the thickness distribution is made non-uniform.

In the tray for CVD of the present invention, it is preferable that a concave portion that is further way apart from the holding portion is provided in a tray main body surface that is opposing to the supported silicon wafer and in the area located below the holding portion. As shown in FIG. 1(d) or FIG. 3(c), a concave portion 2d that is further way apart from the holding portion is provided in a tray main body surface 2a that is opposing to and apart from the supported silicon wafer and in the area located below a holding portion 3c, whereby an increase in the temperature of the holding portion 3c by radiation heat from the tray main body surface 2a that is opposed to the silicon wafer can be reduced. Herewith, heat conduction from the holding portion 3c to a periphery 5b of the silicon wafer is further reduced, the increase in the temperature near the periphery of the silicon wafer is further suppressed, and the thickness of an oxide film formed on a film formation surface 5a of the silicon wafer can be made more uniform.

[Film Forming Method Using Tray for CVD]

The film forming method of the present invention is a film forming method using the tray for CVD of the present invention. As described above, the tray for CVD of the present invention is a tray wherein a holding portion of a supporting member that supports a silicon wafer has its lower surface which is apart from a tray main body surface 2a that is opposed to the silicon wafer, and there is no difference from the conventionally used tray in operation and handling when used.

According to the film forming method of the present invention, since heat conduction from the tray to the silicon wafer is reduced, an oxide film having uniform thickness distribution can be formed on the silicon wafer. Furthermore, when the tray for CVD of the present invention wherein a holding portion comprises a tilted surface is used, the periphery of the silicon wafer is supported, and thus occurrence of contact flaws on the silicon wafer surface can be reduced as much as possible.

EXAMPLES

The following test was performed to confirm the effect of the tray for CVD of the present invention and the film forming method using the same.

[Test Conditions]

As a present invention example 1, a silicon wafer was placed on a tray shown in FIG. 1(a) described above, then a source gas was supplied on the silicon wafer while heating the silicon wafer, and an oxide film ($SiO_2$) was formed on the silicon wafer by a CVD method under atmospheric pressure, and thereafter the thickness of the oxide film was measured.

In the inventive example 1, the film forming of an oxide film by a CVD method was performed using a continuous atmospheric pressure CVD system (AMAX1200, manufactured by Amaya Co., Ltd.), using a silicon wafer with a diameter of 300 mm as the specimen and a mixed gas of monosilane ($SiH_4$) and oxygen ($O_2$) as a source gas, by heating in the CVD system to heat the silicon wafer to 430° C., with the target value of the thickness of an oxide film of 3500 Å.

The thickness of the oxide film was measured at 121 locations on the wafer surface excluded by a 5 mm wide outer peripheral zone, using a spectroscopic ellipsometer.

Figure 11:
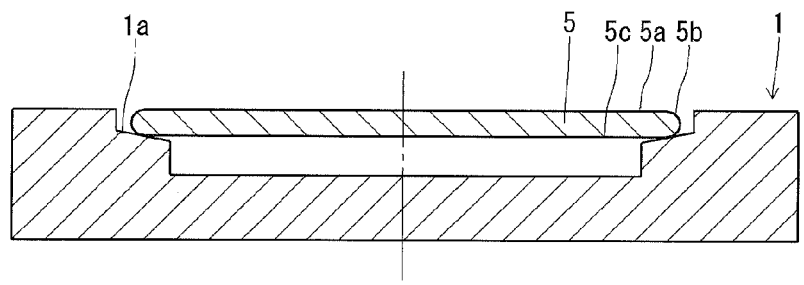
FIG. 11 is a cross section showing a state where a silicon wafer is placed on a conventional tray that supports the silicon wafer in the periphery region.

As a comparative example 1, a silicon wafer was placed on a tray shown in FIG. 11 described above, then an oxide film was formed on the silicon wafer by a CVD method under atmospheric pressure, and thereafter the thickness of the oxide film was measured, in the same manner as in the inventive example 1.

[Test Result]

Figure 7:
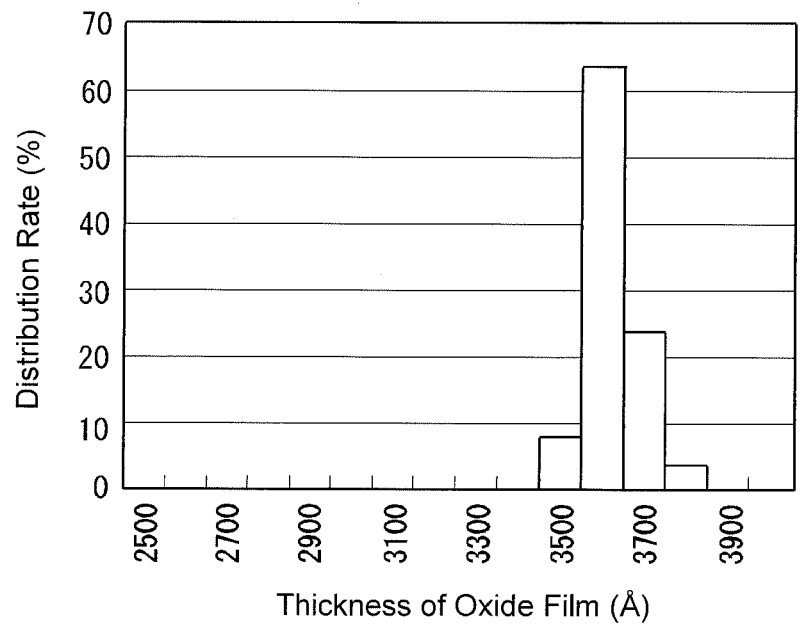
FIG. 7 is a chart showing the thickness distribution of an oxide film when forming a film on a silicon wafer using the tray for CVD of the present invention.

FIG. 7 is a chart showing the thickness distribution of an oxide film when forming a film on a silicon wafer using the tray for CVD of the present invention. Based on the thickness distribution shown in FIG. 7, the inventive example 1 had a thickness of an oxide film distributed in the range from 3400 Å to 3800 Å, and the width of the thickness variation was about 400 Å.

Figure 8:
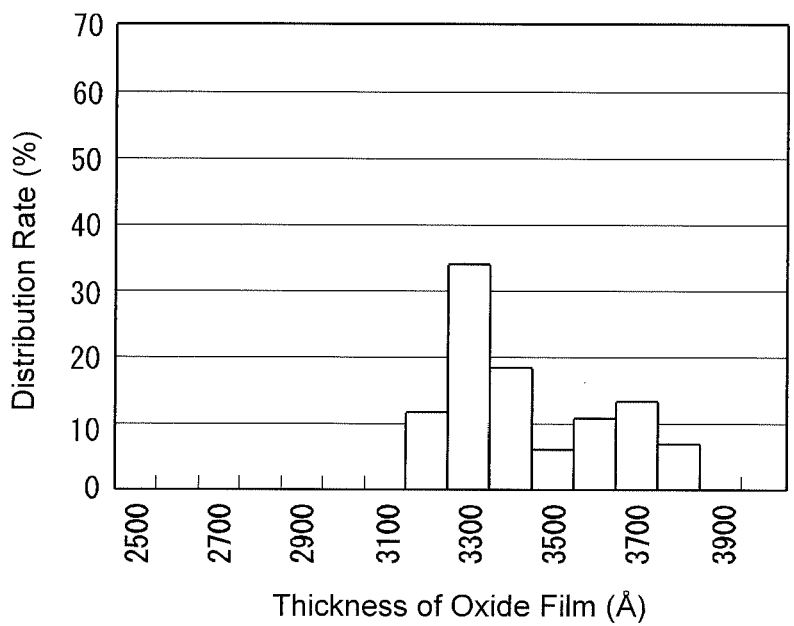
FIG. 8 is a chart showing the thickness distribution of an oxide film when forming a film on a silicon wafer using a conventional tray that supports the periphery of the silicon wafer.

FIG. 8 is a chart showing the thickness distribution of an oxide film when forming a film on a silicon wafer using a conventional tray that supports the periphery of the silicon wafer. Based on the thickness distribution shown in FIG. 8, the comparative example 1 had a thickness of an oxide film distributed in the range from 3200 Å to 3900 Å, and the width of the thickness variation was about 700 Å.

From these results, it is confirmed that, according to the tray for CVD of the present invention and the film forming method using the same, the thickness variation of the film formed on the silicon wafer could be narrowed, more specifically, the thickness of an oxide film could be made uniform.

Next, the following test was performed to confirm the effect that a tray has a structure for reducing the contact area between the supporting member and the tray main body.

[Test Conditions]

A silicon wafer was placed on a tray, then a source gas was supplied on the silicon wafer while heating the silicon wafer, and an oxide film ($SiO_2$) was formed on the silicon wafer by a CVD method under atmospheric pressure, and thereafter the test to measure the thickness of the oxide film was performed. In the present test, the film forming of an oxide film by a CVD method was performed using a continuous atmospheric pressure CVD system (AMAX1200, made by Amaya Co., Ltd.), using a silicon wafer with a diameter of 300 mm as the specimen and a mixed gas of monosilane ($SiH_4$) and oxygen ($O_2$) as the source gas, by heating in the CVD system to heat to 430° C. in the surface temperature of the tray, with the target value of the thickness of the oxide film of 3500 Å.

In the inventive example 2, as a structure for reducing the contact area between the supporting member and the tray main body, a tray having a structure in which a tray main body 2 was provided with land portions and the supporting member was mounted on the land portions 2e, as shown in FIG. 3(b) described above, was used. For the comparison, in the inventive example 3, a tray that did not have a structure for reducing the contact area between the supporting member and the tray main body, as shown in FIG. 1(a) described above, was used. The diameter of the supporting members in the inventive examples 2 and 3 was set to the same dimension.

In the inventive examples 2 and 3, the thickness of an oxide film formed on the silicon wafer was measured using a spectroscopic ellipsometer. In addition, the measurement of the thickness of the oxide film was performed in such a manner that multiple measurements for 121 locations including the center of the silicon wafer were conducted, averaged out and organized by the distance from the center of the silicon wafer, to make a comparison between the inventive examples 2 and 3. Herein, the peripheral excluded zone for the wafer was set to 5 mm wide rim.

[Test Result]

Figure 9:
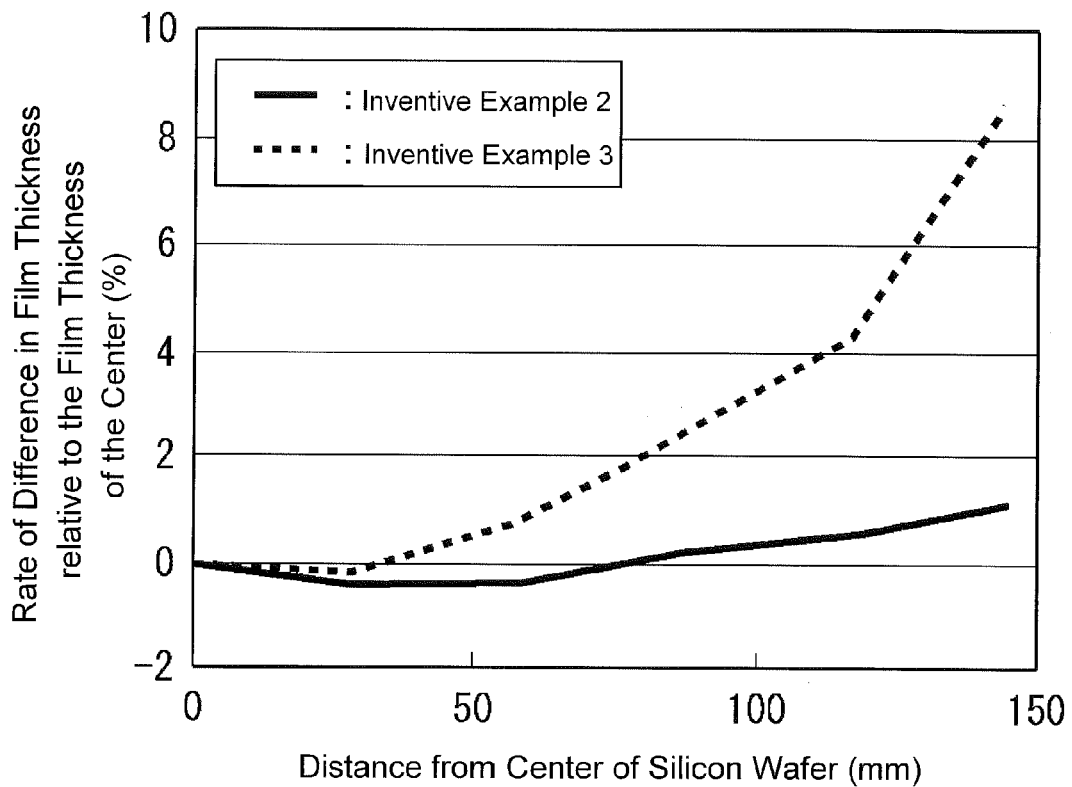
FIG. 9 is a chart showing the thickness distribution of an oxide film formed when a film is formed by a CVD method using a tray having a structure for reducing the contact area or an ordinary tray in absence of such structure.
Figure 10:
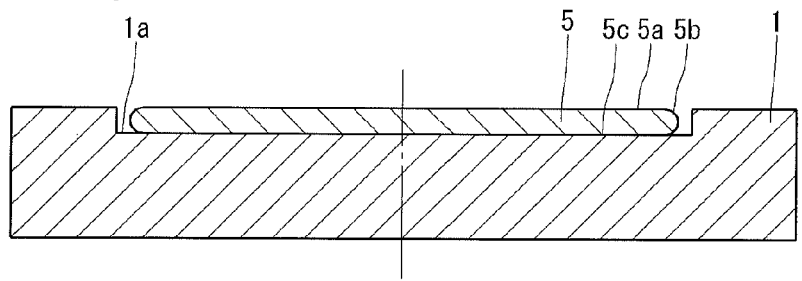
FIG. 10 is a cross section showing a state where a silicon wafer is placed on a conventional tray in which a holding portion is flat.

FIG. 9 is a chart showing the thickness distribution of an oxide film formed when a film is formed by a CVD method using the tray having a structure for reducing the contact area or using the one that does not have such structure. In FIG. 9, the distance from the center of the silicon wafer (mm) is represented by the horizontal axis, and the rate (%) of difference in each measured film thickness from that of the center of the silicon wafer is represented by the vertical axis. Herein, the rate (%) of difference in film thickness from that of the center of the silicon wafer means the proportion of the difference in film thickness from relative to the film thickness of the center of the silicon wafer (Å).

Based on the thickness distribution of the oxide film shown in FIG. 9, in the inventive example 3, a CVD tray that did not have a structure for reducing the contact area between the supporting member and the tray main body was used, and the thickness of the oxide film near the periphery of the silicon wafer was increased by about 8.6% as compared to that of the center. On the other hand, in the inventive example 2, a CVD tray that had a structure for reducing the contact area between the supporting member and the tray main body was used, and the thickness of the oxide film near the periphery of the silicon wafer was increased by about 1.1% as compared to that of the center.

From these results, it was revealed that by providing the tray for CVD of the present invention with a structure for reducing the contact area between the supporting member and the tray main body, an increase in the thickness of the oxide film near the periphery as compared to the center of the silicon wafer can be reduced, and uniform thickness distribution of an oxide film formed when used in film forming by an atmospheric CVD method can be achieved.

INDUSTRIAL APPLICABILITY

Since a tray main body and a holding portion of a supporting member that supports a silicon wafer are apart from each other, the tray for CVD of the present invention can reduce heat conduction from the holding portion to the periphery of the silicon wafer and permit the thickness distribution of the formed oxide film to be uniform when the tray is used in film forming on the silicon wafer by an atmospheric CVD method.

In addition, the holding portion is configured to have a tilted surface and such that the inner circumferential side thereof is closer to the tray main body surface that is opposed to the silicon wafer. Then, when used in film forming on the silicon wafer by an atmospheric CVD method, the periphery of the silicon wafer can be supported and uniform thickness distribution of the formed oxide film can be achieved without generating a contact flaw on a film-formation-free surface of the silicon wafer.

Furthermore, by providing the tray with a structure for reducing the contact area between the supporting member and the tray main body, heat conduction from the tray main body to the supporting member is reduced, and thus heat conduction from the holding portion to the periphery of the silicon wafer is further reduced, and more uniform thickness distribution of the formed oxide film can be achieved.

In addition, according to the film forming method of the present invention, a film can be formed on the silicon wafer with more uniform thickness distribution by using the tray for CVD of the present invention.

Therefore, the tray for CVD of the present invention and the film forming method using the same can be suitably utilized in the production of a silicon wafer.

REFERENCE SIGNS LIST

1: Tray for CVD, 1a: Holding portion, 2: Tray main body,
2a: Surface that is opposed to supported placed silicon wafer,
2b: Inner periphery of receiving portion, 2c: Top surface of receiving portion
2d: Concave portion,
2e: Land portion,
2f: Groove,
3: Supporting member,
3a: Top surface of supporting member,
3b: Outer periphery of supporting member,
3c: Holding portion of supporting member,
3d: Lower surface of holding portion
3e: Strut,
3f: Supporting part,
3g: Lower surface of supporting part,
4: Jig,
5: Silicon wafer,
5a: Film formation surface,
5b: Periphery,
5c: Film-formation-free surface

What is claimed is:

1. A tray for CVD, which is used in film forming by a CVD method, comprising:
a tray main body; and
a supporting member mounted on the tray main body and supporting a silicon wafer, wherein
the supporting member is provided with a holding portion on which the silicon wafer is directly placed, and
the holding portion has its lower surface which is apart from a surface of the tray main body that is opposed to and apart from the supported silicon wafer,
the tray main body has a concave receiving part that houses the supporting member, the supporting member is disposed within the concave receiving part, and
an inner periphery of the concave receiving part is configured to have a tilted surface.

2. The tray for CVD according to claim 1, wherein the holding portion is configured to have a tilted surface and such that an inner circumferential side thereof is closer to the surface of the tray main body that is opposed to and apart from the supported silicon wafer, thereby supporting the silicon wafer in its periphery region.

3. The tray for CVD according to claim 1, wherein the holding portion is in a ring shape.

4. The tray for CVD according to claim 1, wherein the holding portion is made of SiC.

5. The tray for a CVD according to claim 1, wherein the tray has a structure in which the tray main body is provided with land portions, and the supporting member is mounted on the land portions.

6. The tray for CVD according to claim 1, wherein the tray has a structure in which the supporting member is mounted on the tray main body maintaining point contact or line contact.

7. The tray for CVD according to claim 1, wherein an inner periphery of the receiving part is configured such that an upper end thereof is back away from the center of the receiving part, and the higher a position in the supporting member is, the more distant from the inner periphery of the receiving part the supporting member is.

8. A tray for CVD, which is used in film forming by a CVD method, comprising:
a tray main body; and
a supporting member mounted on the tray main body and supporting a silicon wafer, wherein the supporting member is provided with a holding portion on which the silicon wafer is directly places, the holding portion has its lower surface which is apart from a surface of the tray main body that is opposed to and apart from the supported silicon wafer, the tray main body has a concave receiving part that houses the supporting member, the supporting member is disposed within the concave receiving part, and a concave portion is provided in a portion of a surface of the tray body, the portion of the surface opposing to the holding portion, and an inner periphery of the concave receiving part is configured to have a tilted surface.

9. A tray for CVD, wherein the tray as defined in claim 8 has a structure for reducing a contact area between the supporting member and the tray main body.

10. The tray for CVD according to claim 9, wherein, as the structure for reducing the contact area, the tray has a structure in which the tray main body is provided with land portions, and the supporting member is mounted on the land portions.

11. The tray for CVD according to claim 10, wherein an inner periphery of the receiving part is configured to have a tilted surface and such that an upper end thereof is back away from the center of the receiving part.

12. The tray for CVD according to claim 9, wherein, as the structure for reducing the contact area, the tray has a structure in which the supporting member is mounted on the tray main body maintaining point contact or line contact.

13. A tray for CVD, wherein the tray as defined in claim 9 is further provided with jigs that prop the supporting member, and as the structure for reducing the contact area, the tray has a structure in which the supporting member is mounted on the tray main body maintaining point contact or line contact by the jigs.

14. The tray for CVD according to claim 8, wherein the holding portion having the tilted surface is configured such that an inner circumferential side thereof is closer to the surface of the tray main body that is opposed to and apart from the supported silicon wafer, thereby supporting the silicon wafer in its periphery region.

15. The tray for CVD according to claim 8, wherein the holding portion is in a ring shape.

16. The tray for CVD according to claim 8, wherein the holding portion is made of SiC.

17. A film forming method, comprising the steps of:
placing a silicon wafer on a tray; and then
heating the silicon wafer while supplying a source gas on the silicon wafer, to form a film on the silicon wafer by a CVD method, wherein
the tray for CVD as defined in any one of claims 1 to 16 is used as the tray.

* * * * *